United States Patent [19]

Nakagawa et al.

[11] Patent Number: 4,743,864
[45] Date of Patent: May 10, 1988

[54] POWER SAVING INTERMITTENTLY OPERATED PHASE LOCKED LOOP

[75] Inventors: Jun'ichi Nakagawa, Tokorozawa; Yoshitomo Kuwamoto, Yokosuka; Hidefumi Kimura; Hideaki Watanabe, both of Katsuta; Masanori Ienaka, Takasaki, all of Japan

[73] Assignees: Hitachi, Ltd; Hitachi Video Engineering, Inc., both of Tokyo, Japan

[21] Appl. No.: 922,300

[22] Filed: Oct. 23, 1986

[30] Foreign Application Priority Data

Oct. 23, 1985 [JP] Japan .................................. 60-235262
Mar. 14, 1986 [JP] Japan .................................. 61-54800

[51] Int. Cl.$^4$ .............................................. H03L 7/18
[52] U.S. Cl. ..................................... 331/1 A; 331/14; 331/17; 331/25; 331/27; 307/516; 455/343
[58] Field of Search ..................... 331/1 A, 14, 17, 25, 331/27; 455/343

[56] References Cited

U.S. PATENT DOCUMENTS 4,625,180  11/1986  Itaya et al. ......................... 331/14 X

FOREIGN PATENT DOCUMENTS 0012899  7/1980  European Pat. Off. .
1491329  11/1977  United Kingdom .
2025171  1/1980  United Kingdom .
1582700  1/1981  United Kingdom .
2147470  5/1985  United Kingdom .

Primary Examiner—Siegfried H. Grimm
Attorney, Agent, or Firm—Antonelli, Terry & Wands

[57] ABSTRACT

In an intermittently operative phase-locked loop, in order to prevent the oscillator frequency from significantly changing at the time of turning on of an electric power source, a point in time at which a phase difference between clock signals respectively fed to a reference frequency divider and to a frequency divider for dividing the output frequency of a voltage-controlled oscillator becomes substantially zero is detected, and the two frequency dividers are initialized when the above-mentioned point in time is detected after turning on of the electric power source.

18 Claims, 11 Drawing Sheets

FIG. 11-B
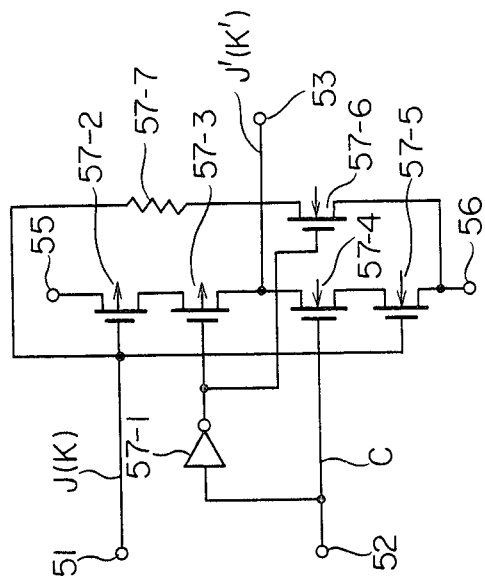
FIG. 11-A
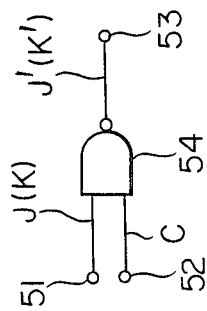

POWER SAVING INTERMITTENTLY OPERATED PHASE LOCKED LOOP

BACKGROUND OF THE INVENTION

The present invention generally relates to phase-locked oscillators, particularly to a phase-locked oscillator employing a phase-locked loop, and more particularly to a phase-locked oscillator employing a phase-locked loop, which is suitable for applications requiring conservation of electric power such as in a portable radio receiver/transmitter, and the like, and in which the phase-locked loop is intermittently operated.

Among means for saving average electric power consumption on radio receiver/transmitter, especially on portable radio receiver/transmitter, means of intermittently operating part of circuits of phase-locked oscillators requiring relatively large electric power have been described in Japanese Patent Unexamined Publication Nos. 58-66434 and 58-159029. Generally such a phase-locked oscillator comprises a reference oscillator, a reference frequency divider for dividing the frequency of output clocks of the reference oscillator, a voltage-controlled oscillator (hereinafter abbreviated to "VCO"), a frequency divider for dividing the frequency of the output clocks of the VCO, a phase comparator for comparison in phase between the frequency-division carry-signals of the frequency dividers, and a loop filter for smoothing the output error signal of the phase comparator and for feeding a VCO control voltage. In the above-mentioned prior art references, the average electric power consumption saving is attained by wholly or partially interrupting the electric power supply for the circuits except the VCO. In this case, a voltage-hold circuit for holding a control voltage to be applied to the VCO (that is, the output of the loop filter) to a value just before the cut-off of the electric power supply is provided to keep the output frequency of the VCO constant during the cutting-off of the elecric power supply.

However, no consideration has been given to the fact that the two output signals of the reference frequency divider and the frequency divider to be fed to the phase comparator should be made to be in phase whenever the electric power supply is applied again from its off-state.

Each of the reference frequency divider and the frequency divider generally includes a counter constituted by one or more bistable trigger circuits or flipflops. The number of internal states in a binary counter constituted by a plurality of flip-flops, n in number, is $2_n$, and the internal state of the counter at the time of turning on of the electric power supply is indefinite. In other words, the number of input clock signals in a period from the turning on of the electric power supply to the output of the first carry is within a range of $2_n$ but indefinite whenever the electric power supply is turned on. The electric power supply is cut off by an intermittent operation from the phase-locked state. For this reason, the probability that the respective signals fed to the phase comparator at the time of turning on of the electric power supply will become in phase is very little even if the output frequency of the VCO does not change during the off-state of the electric power supply, so that, in general, a phase difference occurs between the signals. Because the phase difference after turning on of the electric power supply produces a large error signal to be applied to the VCO through the loop filter, the frequency of the VCO is temporarily widely changed. Thereafter the frequency of the VCO is returned to a locked state by a general pull-in effect. The use of such an intermittently operative phase-locked oscillator as an oscillator for a receiver of a radio receiver/transmitter causes a problem in that unreceivable conditions temporarily occur because of the shifting of the frequency of the VCO every time the electric power supply is turned on in the intermittent operation.

SUMMARY OF THE INVENTION

An object of the present invention is to provide a phase-locked oscillator arranged to perform an intermittent operation, in which oscillator frequency change is to be minimized whenever an electric power source is turned on.

To attain the above object, according to the present invention, counters included in a phase-locked loop of such a phase-locked oscillator as shown in FIG. 1 are initialized to a predetermined state to thereby prevent an erroneous phase-difference signal from being generated.

In a preferred embodiment, to make the timing for the initialization optimum, there are newly provided a zero-phase detecting circuit for detecting the fact that the phase difference between clocks respectively fed to a reference frequency divider and a frequency divider becomes substantially zero to thereby generate a zero-phase signal, and a preset pulse generating circuit for generating a preset pulse signal to initialize both the reference frequency divider and the frequency divider in synchronism with the zero-phase signal generated first after the launching of the electric power source.

The above-mentioned and other features and objects of this invention will become more apparent by reference to the following description taken in connection with the accompanying drawings.

BRIEF DESCRIPTION OF THE DRAWINGS

FIGS. 11A, 11B and 12 are circuit diagrams of important parts of the embodiment depicted in the block diagram of FIG. 10.

DESCRIPTION OF THE PREFERRED EMBODIMENTS

Figure 1:
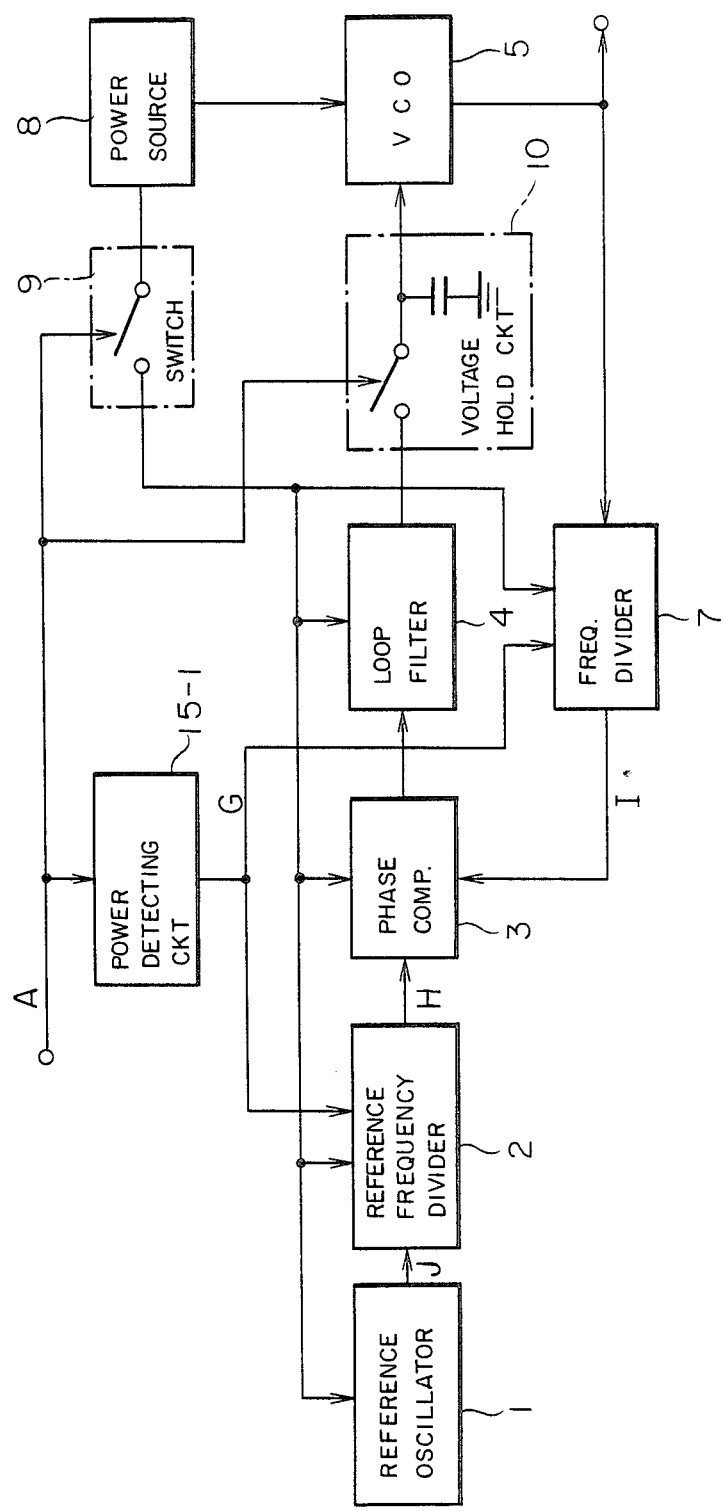
FIG. 1 is a block diagram of an embodiment of the phase-locked oscillator according to the present invention.

FIG. 1 is a block diagram showing the arrangement of an embodiment of the phase-locked oscillator of the present invention.

Referring to FIG. 1, the output of a reference oscillator 1 is frequency-divided into a signal H of a period Tr by a reference frequency divider 2. The signal H is fed to one input terminal of a phase comparator 3. The output of a VCO 5 is frequency-divided into a signal I of a period Tv by a frequency divider 7. The signal I is fed to the other input terminal of the phase comparator 3. A phase difference component between the two signals H and I produced from the phase comparator 3 is fed back to a frequency control terminal of the VCO 5 via a loop filter 4 and a voltage-hold circuit 10. On the other hand, an intermittent control signal A controls a switch 9 to thereby interrupt electric power supply to the circuits 1, 2, 3, 4 and 7 wholely or partially. In this embodiment the intermittent control signal A is fed also to an electric power source launching detecting circuit 15-1. The output signal of the circuit 15-1, that is, an initial state setting signal G is applied to the frequency dividers 2 and 7.

The operations of the dividers will be now supplemented. For example, let the frequency dividers 2 and 7 be formed by down-counters, the frequency division modulus, the initial state, and the carry-pulse output state of the reference frequency divider 2 are represented by R, "R", and "1" respectively. The internal state of the reference frequency divider 2 periodically changes so as to be "R", "R-1", ..., "2", "1", and "R" successively as long as electric power is continuously supplied. Similarly to this, when the frequency division modulus of the frequency divider 7 is represented by N, the internal state thereof periodically changes between the initial state "N" and the carry-pulse output state "1".

Figure 2:
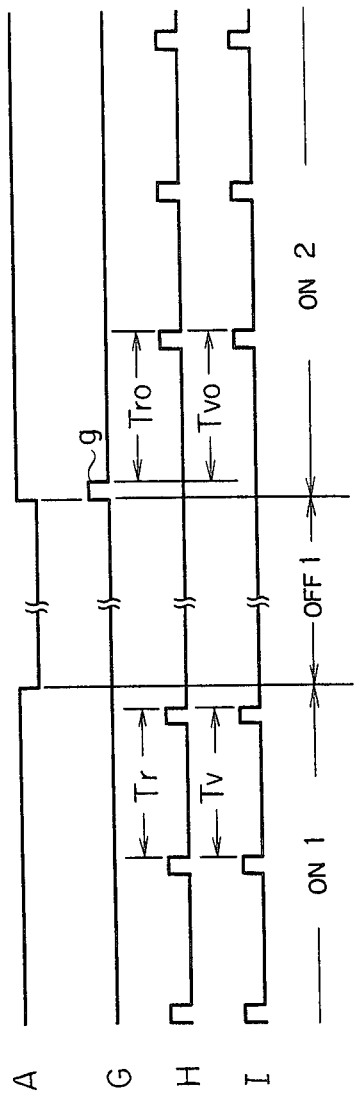
FIG. 2 is a waveform diagram for explaining the operation of the same embodiment.

As shown in FIG. 2, when the signal A is at a "high" level, the switch 9 is closed to thereby energize the circuits. Accordingly, this state expresses the "ON" state of the intermittent operation. When the signal A is at a "low" level, the switch 9 is opened to thereby interrupt electric power supply to the circuits. Accordingly, this state expresses the "OFF" state of the intermittent operation.

In the "ON 1" state of FIG. 2, the phase-locked loop of FIG. 1 is in a phase-locked state, the period Tr between adjacent carry-pulses of the signal H and the period Tv between adjacent carry-pulses of the signal I are equal to each other, and the phase relation therebetween is constant. Next, the operation shifts into the "OFF 1" state of FIG. 2. It is assumed that the frequency of the VCO 5 does not change during the "OFF" state. Next, the signal A turns to a "high" level and the operation shifts into the "ON 2" state. The electric power detecting circuit 15-1 makes the initial state setting signal G turn to a "high" level for a short time in synchronism with the point in time in which the signal A turns from a "low" level to a "high level", and thereby generates a pulse g. By the pulse g, the frequency dividers 2 and 7 are simultaneously set to the initial states "R" and "N", respectively. Accordingly, the time Tro or Tvo required for generating the first carry-pulse on the signal H or I after the initialization is equal to the period Tr or Tv, and the carry-pulses on the signals H and I are equal in position to each other.

Although the above description contains an assumption that the frequency of the VCO 5 does not change during the "OFF" term, the frequency changes a little in fact. In this case, the time Tro required for generating the first carry-pulse on the signal H after the initialization in each of the frequency dividers by the pulse g is not equal to the time Tvo required for generating the first carry-pulse on the signal I after the initialization. The difference therebetween is detected as a phase error by the phase comparator and is fed back to the VCO 5 via the loop filter 4 and the voltage-hold circuit 10 to thereby correct the VCO frequency.

The circuits 15-1, 2 and 7 will be described in more detail hereunder. The electric power detecting circuit 15-1 is provided to generate a differential pulse at a level change point of the intermittent control signal A, that is, at a rise point of FIG. 2. The circuit 15-1 is constituted by a well-known circuit, such as a circuit using gate delay, a clock differentiating circuit having two D-type flip-flops cascade-connected, or the like.

Figure 3:
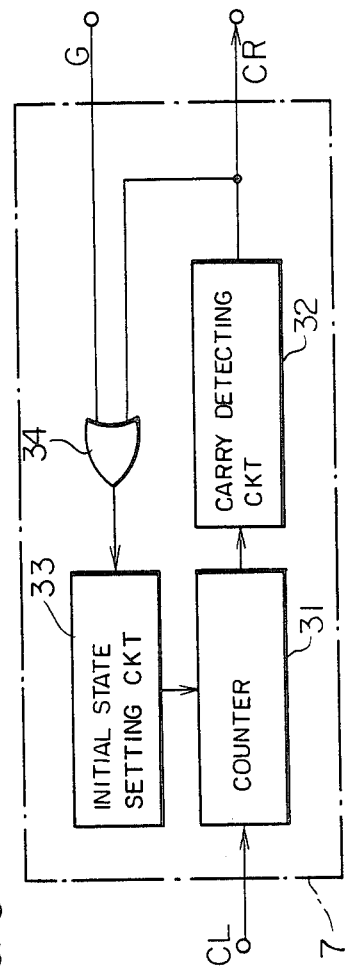
FIGS. 3 and 4 are detailed circuit diagrams of part of the same embodiment.

FIG. 3 shows an embodiment of the frequency divider 7 (or the reference frequency divider 2). This differs from a general frequency divider in that an OR gate 34 is additionally provided to receive the initial state setting signal G from outside. When a clock CL is fed to a counter 31 the state of which is monitored by a carry-detecting circuit 32, a carry-pulse CR is generated under the carry-state. The carry-pulse CR drives an initial state setting circuit 33 via the OR gate 34 so that the counter 31 is initialized. Similarly to this, the counter 31 is initialized by the initial state setting signal G regardless of the state of the counter at that time.

Figure 4:
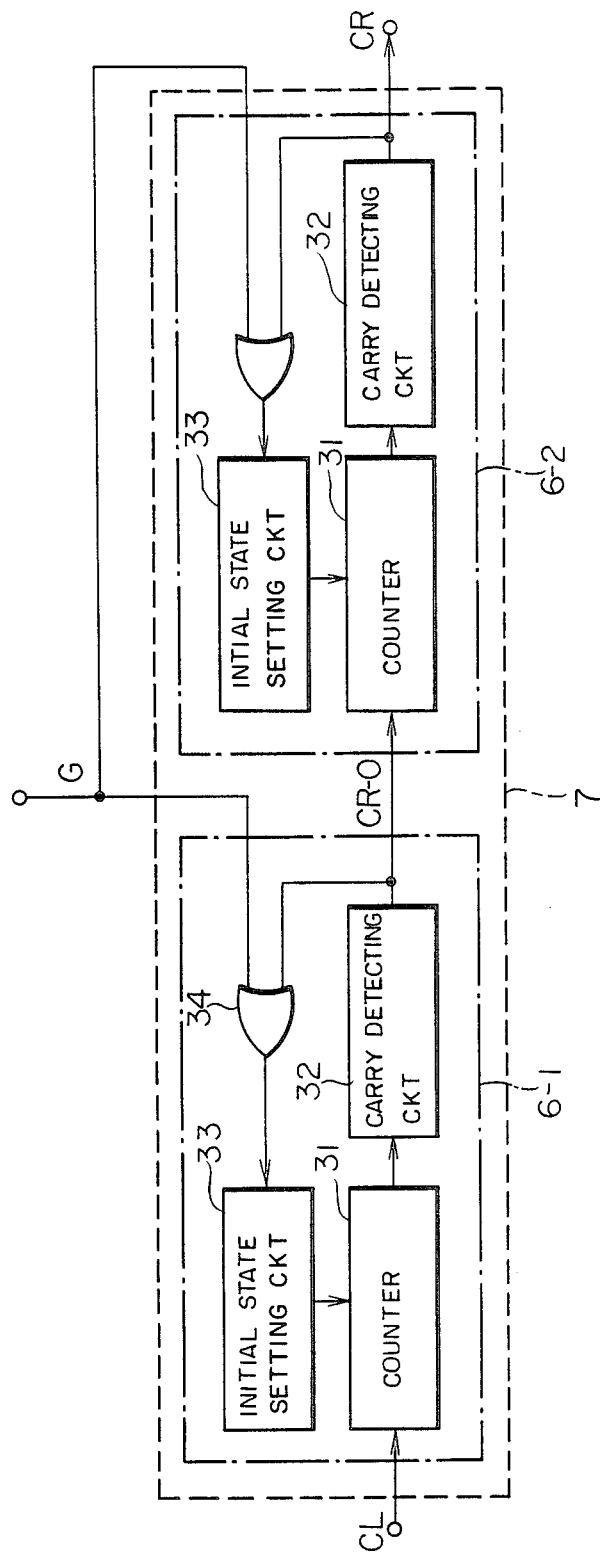

FIG. 4 shows another embodiment of the frequency divider 7. In the case where the frequency of the VCO 5 is high, it is necessary that the frequency divider 7 is constituted by a high-speed pre-scaler 6-1 and a low-speed frequency divider 6-2. In this embodiment, each of the high-speed pre-scaler 6-1 and the low-speed frequency divider 6-2 employs the same circuit arrangement as shown in FIG. 3, so that initialization can be made externally. The carry-output CR-0 of the high-speed pre-scaler 6-1 is fed to the low-speed frequency divider 6-2 as a clock for the latter.

Although the embodiment of FIG. 1 shows the case where the change point of the intermittent control signal is detected by the electric power detecting circuit 15-1, the invention is not limited to this embodiment, but applicable to the case where the output of the switch 9, that is, the on/off state of the electric power source, is detected as another embodiment.

Even if either the reference frequency divider 2 or the frequency divider 7 in the embodiment of FIG. 1 is intermittently operated, it is necessary to initialize both the two frequency dividers at the time of launching the electric power supply. However, if the phase error between the two signals fed to the phase comparator after the turning on of electric power supply is permitted within a certain limit, it is not necessary to initialize all of the counters in the two frequency dividers at the time of turning on of the electric power supply. In particular, it is not necessary to initialize lower significant bits of the counters in the two frequency dividers, while the other, more significant bits of the counters should be initialized.

Other embodiments effectively applied to the case where the frequency of the reference oscillator differs from the frequency of the VCO or in other words where the instantaneous phase difference between the two oscillators changes every moment, will be described hereunder. More in detail, the embodiments are arranged to detect the point in time when the phase difference between clock signals respectively fed to the reference frequency divider and the frequency divider becomes minimized (preferably zero) for the purpose of minimizing the phase difference between two signals applied to the respective inputs of the phase comparator after the turning on of the electric power supply in an intermittent operation or in other words for the purpose of minimizing the phase difference between two signals generated from the frequency dividers, and thereby initialize the two frequency dividers at that point in time.

Figure 5:
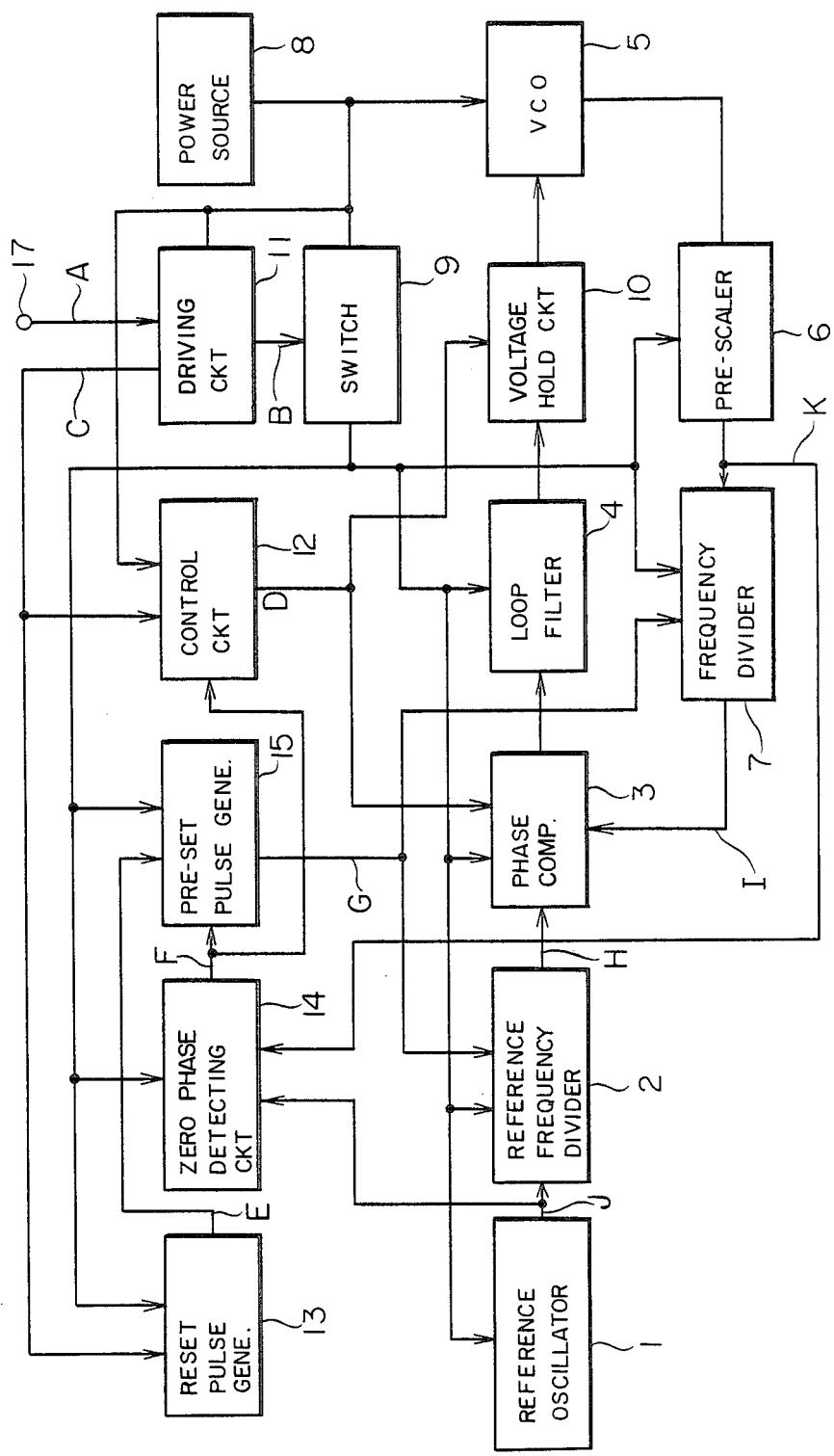
FIG. 5 is a block diagram of another embodiment of the phase-locked oscillator of the invention.

FIG. 5 is a block diagram showing the arrangement of another embodiment of the phase-locked oscillator according to the invention.

In FIG. 5, a clock signal J generated from a reference oscillator 1 is fed to a reference frequency divider 2, and a frequency-division carry-signal H of the reference frequency divider 2 is fed to one input terminal of a phase comparator 3. On the other hand, a clock signal generated from a voltage-controlled oscillator (VCO) 5 is fed to a pre-scaler 6, and an output clock signal K of the pre-scaler 6 is fed to a frequency divider 7. A frequency-division carry-signal I of the frequency divider 7 is fed to the other input terminal of the phase comparator 3, and a phase error signal generated from the phase comparator 3 is smoothed by a loop filter 4. The smoothed phase error signal is applied to a frequency-control terminal of the VCO 5 via a voltage-hold circuit 10 to perform an intermittent operation. The phase-locked oscillator of this embodiment is constituted by the above-mentioned circuit elements. Circuit elements 9 and 11 to 15 which will be described later and the circuit 10 is additionally provided for the intermittent operation. An intermittent operation control signal A fed through a terminal 17 is converted into a signal B through a driving circuit 11, so that the signal B drives a switch 9 to interrupt a voltage and a current fed from a power source 8. Another signal C generated from the driving circuit 11 is fed to both a control circuit 12 and a reset pulse generating circuit 13 which in turn supplies a reset-pulse signal E to a preset pulse generating circuit 15 at the time of turning on of the electric power supply. A zero-phase detecting circuit 14 receives the clock signals J and K and supplies a zero-phase signal F to both the preset pulse generating circuit 15 and the control circuit 12. The preset pulse generating circuit 15 detects the zero-phase signal F fed first after the turning on of the electric power supply, and generates a preset-pulse signal G to be applied to both the reference frequency divider 2 and the frequency divider 7. A signal D generated from the control circuit 12 controls interruption/passage of the signals H and I fed to the phase comparator 3 as well as controls the state of voltage-holding/current-conduction of the voltage-hold circuit 10. In this embodiment, the VCO 5, the switch 9, the driving circuit 11, and the control circuit 12 are supplied with a voltage directly from the electric power source 8, and the other circuits are energized with an intermittent voltage through the switch 9.

Figure 6:
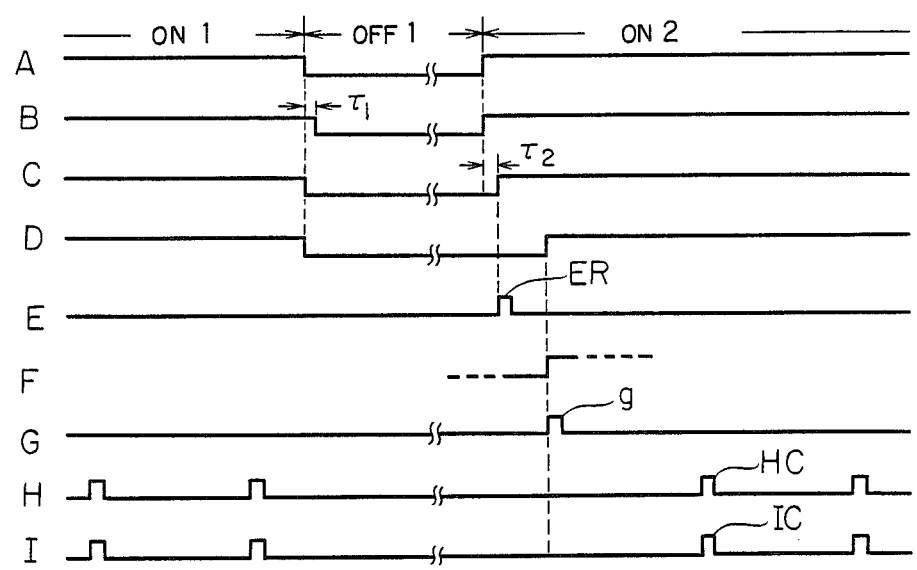
FIG. 6 is a waveform diagram for explaining the operation of the embodiment of FIG. 5.

The operation of the embodiment of FIG. 5 will be described by reference to the waveform diagram of FIG. 6. Let the intermittent operation be in an "ON"-state when the intermittent control signal A is at a "high" level or let the intermittent operation be in an "OFF" state when the signal A is at a "low" level. The driving circuit 11 generates the signal B obtained by delaying the falling point of the signal A by a certain amount of time $\tau_1$, and the signal C obtained by delaying the rising point of the signal A by a certain amount of time $\tau_2$. The control circuit 12 turns the signal D to a "low" level in response to the falling of the signal C to thereby temporarily hold the output voltage of the loop filter 4 in the voltage-hold circuit 10. Taking into consideration the response time required for the voltage-hold operation, the time for interrupting the electric power source by the switch 9 is delayed by the amount of time $\tau_1$ compared with the falling point of the signal A. While the intermittent operation is in the "ON 1" state of FIG. 6, the phase-locked oscillator is in the phase-locked state and, accordingly, the signals H and I are in phase with each other. Next, when the intermittent operation turns to the "OFF 1" state, the frequency of the VCO 5 is kept constant owing to the operation of the voltage-hold circuit 10. Next, when the intermittent operation turns to the "ON 2" state, the signal B rises in synchronism with the rising of the signal A to thereby turn on the switch 9 to energize each of the circuits. Taking into consideration the response time in each of the circuits after the turning on of the electric power source, the rising point of the signal C is delayed by the amount of time $\tau_2$ compared with the falling point of the signal B. In order to remove disused frequency-division carry-signals generated from the reference frequency divider 2 and the frequency divider 7 just after the turning on of the electric power source, the signals H and I are gated at the input stage of the phase comparator 3 by the signal D with the "low" level. The reset pulse generating circuit 13 detects the rising of the signal C to thereby generate a reset pulse ER for the signal E. Thereby, the preset pulse generating circuit 15 turns to the state of operation. The operation of the zero-phase detecting circuit 14 will be described in detail later. Let the clock signals J and K be instantaneously substantially in phase when the zero-phase signal F is at a "high" level, or let the clock signals J and K be out of phase when the signal F is at a "low" level. The preset pulse generating circuit 15 detects the "high" level of the zero-phase signal F fed first after the turning on of the electric power source to thereby generate a preset pulse g. Because the reference frequency divider 2 and the frequency divider 7 are initialized by the pulse g, the subsequently generated frequency division carry-pulses HC and IC are substantially in phase. The control circuit 12 makes the signal D rise to a "high" level in synchronism with the generation of the preset pulse g. Accordingly, the input-stage gate of the phase comparator 3 becomes conductive to feed the frequency division pulses HC and IC to the body of the phase comparator, and, at the same time, the voltage-hold circuit 10 change to a non-hold state to receive a new voltage from the loop filter 4. Thereafter, the phase-locked oscillator performs a general phase-locked operation. Owing to the operation of the signal D, the input-stage gate of the phase comparator 3 blocks disused carry-signals generated from both the reference frequency divider 2 and the frequency divider 7 till the zero-phase signal turns to a "high" level after the turning on of the electric power source.

It is a matter of course that the reference frequency divider 2 and the frequency divider 7 used in the embodiment of FIG. 5 are able to be initialized. For example, if the pre-scaler 6 used is able to be initialized, it is apparent that the same operation as in the embodiment of FIG. 1 can be carried out in the case where the signal G is fed into the pre-scaler and where the output of the VCO 5 instead of the clock signal K is fed to the zero-phase detecting circuit 14. If the pre-scaler is not used, the same operation can be obtained in the case where the VCO output is fed to the zero-phase detecting circuit.

Figure 7:
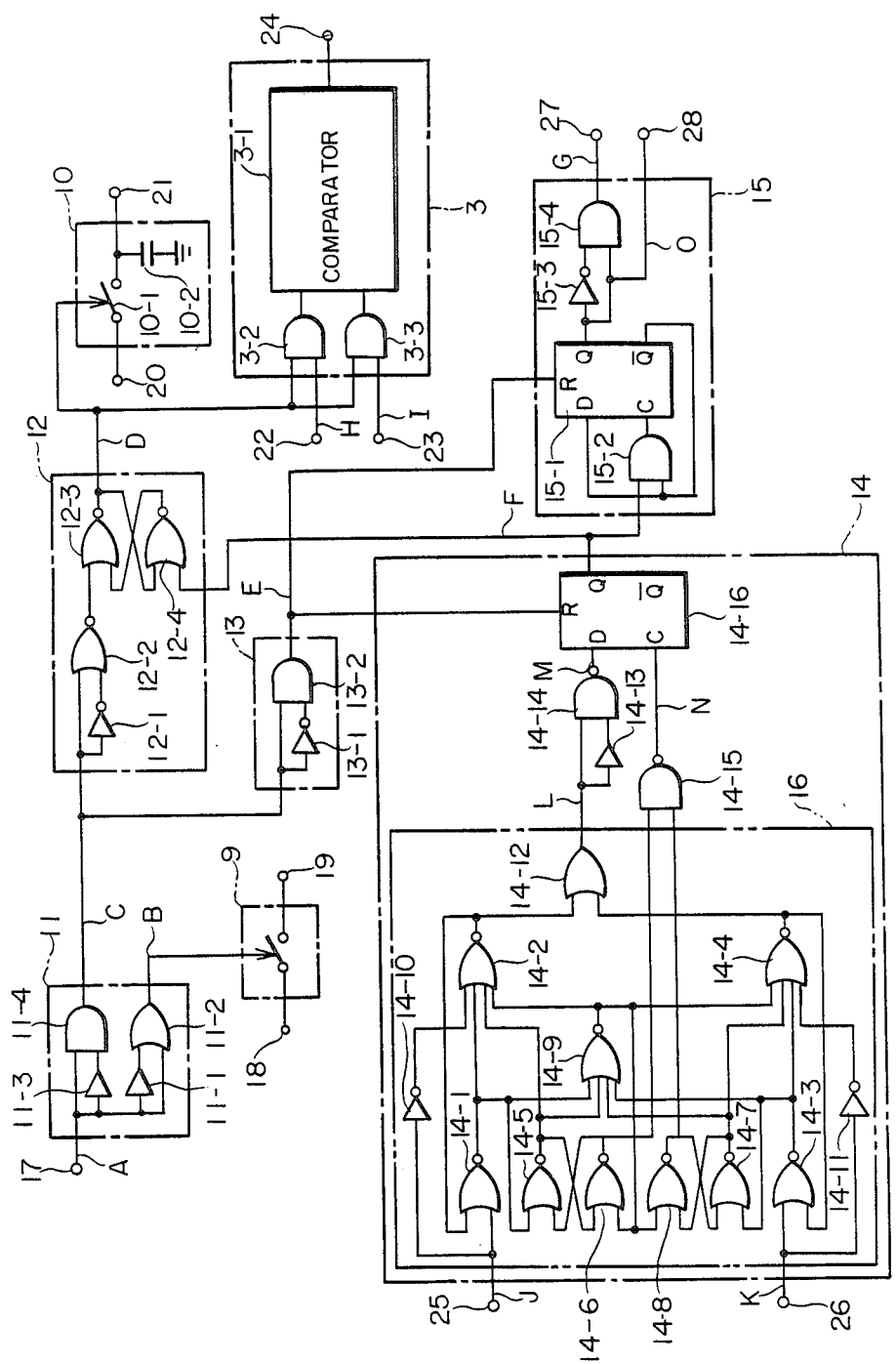
FIG. 7 is a circuit diagram of important parts of the embodiment of FIG. 5.
Figure 8:
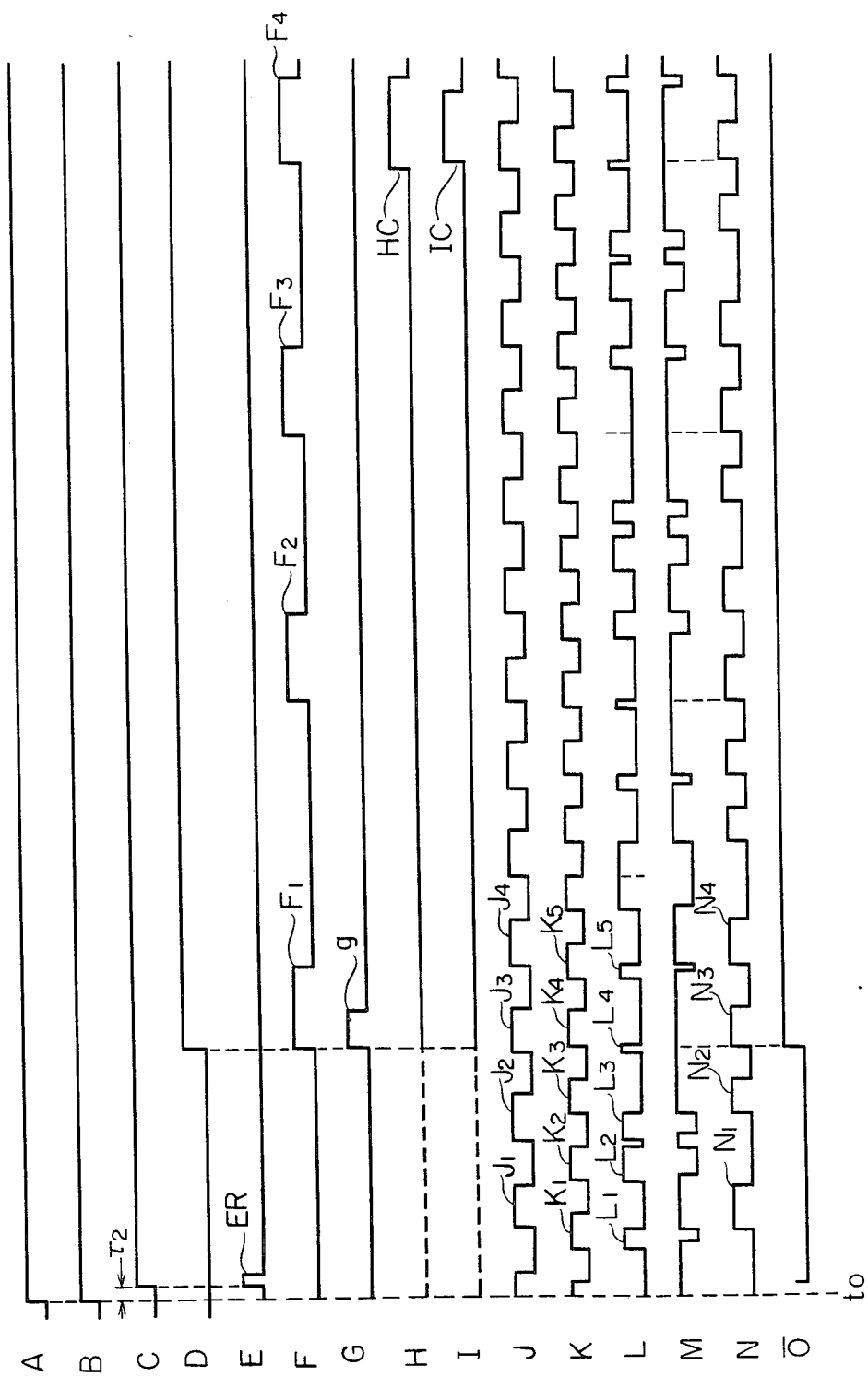
FIG. 8 is a waveform diagram for explaining the operation of FIG. 7.

FIG. 7 shows an embodiment in which the main circuits of the FIG. 5 embodiment are realized by using more specific circuit elements. FIG. 8 is a waveform diagram of the signals at various parts in the embodiment of FIG. 7. Like circuits, signals or waveforms in FIGS. 5 to 8 are identified by the same reference characters. An intermittent control signal A received at a terminal 17 of FIG. 7 is fed to a delay element 11-1 of delay time $\tau_1$, an OR gate 11-2, a delay element 11-3 of delay time 2, and an AND gate 11-4 constituting a driving circuit 11. The output of the delay element 11-1 is fed to the other input terminal of the OR gate 11-2. The output signal of the OR gate 11-2 is shown as a signal B. The output of the delay element 11-3 is fed to the other input terminal of the AND gate 11-4. The output signal of the AND gate 11-4 is shown as a signal C. The delay time $\tau_1$ or $\tau_2$ corresponds to the amount of time $\tau_1$ or $\tau_2$ shown in FIG. 6. The signal B drives a switch 9 to open/close the path between input/output terminals 18 and 19. The control circuit 12 is constituted by a falling differential pulse generating part having a delay inverter 12-1 and a two-input NOR gate 12-2, and an R-S flip-flop part having two-input NOR gates 12-3 and 12-4. The signal C is fed to both the delay inverter 12-1 and the NOR gate 12-2, and the output of the latter is fed to the NOR gate 12-3. When the signal C falls, the output signal D of the NOR gate 12-3 turns to a "low" level. The voltage-hold circuit 10 is constituted by a switch 10-1 for open/close the path between an input terminal 20 and an output terminal 21, and a capacitor 10-2 holding a control voltage provided at the output terminal side. When the signal D falls, the switch 10-1 turns to an open state. Accordingly, the voltage having been impressed on the terminal 20 by the loop filter just before the falling point of the signal D is held by the capacitor 10-2 and is applied to the VCO 5 through the terminal 21. The phase comparator 3 is constituted by a comparator body 3-1 and two-input AND gates 3-2 and 3-3. A signal H fed from a terminal 22 and the signal D are fed to the gate 3-2, and a signal I fed from a terminal 23 and the signal D are fed to the gate 3-3. The respective phases of the output signals of the two gates 3-2 and 3-3 are compared with each other, and, as the result, an error signal is fed to the loop filter 4 from a terminal 24. The reset pulse generating circuit 13 is constituted by a delay inverter 13-1 and a two-input AND gate 13-2 and generates a reset pulse ER for a signal E in synchronism with the rising of the signal C. The zero-phase detecting circuit 14 is constituted by a phase comparing part 16 surrounded by the two-dotted chain lines of FIG. 7 and a pulse width discriminating part provided to the rear stage thereof. In the phase comparing part 16, a circuit constituted by NOR gates 14-1 to 14-9 is commonly known as a phase/frequency comparator, and therefore, detailed description of the operation thereof will be omitted. In this embodiment, in order to eliminate a frequency discriminating function from a phase/frequency comparator, clock signals J and K are fed to four-input NOR gates 14-2 and 14-4 through inverters 14-10 and 14-11, respectively. As the result, a pulse signal corresponding to the instantaneous phase difference between the clock signals J and K fed to terminals 25 and 26 is generated from a gate 14-12 through the gate 14-2 or 14-4. The pulse width discriminating part is constituted by a D-type flip-flop 14-16, a data gate (constituted by a delay element 14-13 and a two-input NAND gate 14-14), and a clock gate 14-15. The flip-flop 14-16 is of such a type that a data signal fed to a terminal D is transmitted to a terminal Q with the rising of a clock signal fed to a terminal C and that the output of the terminal Q is reset when a signal applied to a terminal R is at a "high" level. In this embodiment, the signal E is applied to the terminal R to thereby keep the output of the terminal Q at a "low" level at the time of turning on of the electric power source to thereby prevent the malfunction thereof. The output signal L of the two-input OR gate 14-12 receiving the output signals of the gates 14-2 and 14-4 is fed to both the delay element 14-13 and the two-input NAND gate 14-14, the output of the former being fed to the latter. The output signal M of the gate 14-14 is fed to the terminal D of the flip-flop 14-16. The output signal N of the two-input NAND gate 14-15 receiving the output signals of the gates 14-6 and 14-8 is fed to the terminal C of the flip-flop 14-16. Because the rising part of the signal L is scraped off for a delay time $\tau_3$ by the delay element 14-13, a corresponding part of the signal M is kept at a "high" level in the case where the pulse width of the signal L is less than the time $\tau_3$. The signal M after the discrimination of pulse width is sampled by the signal N and is held in the flip-flop 14-16. The output signal F from the terminal Q of the flip-flop 14-16 is fed to the gate 12-4 to thereby make the signal D rise to thereby make the switch 10-1 turn on. In the preset pulse generating circuit 15, a function of detecting the "high" level of the signal F appearing first after the turning on of the electric power source is attained by both a D-type flip-flop 15-1 and a two-input AND gate 15-2. The flip-flop 15-1 is of the same type as the flip-flop 14-16. The output from a terminal $\overline{Q}$ of the flip-flop 15-1 is fed to both a terminal D thereof and the gate 15-2. A terminal C of the flip-flop receives the output of the gate 15-2, and a terminal R receives the signal E. The other input terminal of the gate 15-2 receives the signal F. When the electric power source is turned on, both the signal F and the output signal O from a terminal Q of the flip-flop 15-1 turn to a "low" level and the output from the terminal $\overline{Q}$ turns to a "high" level. Accordingly, the gate 15-2 is opened for the signal F. With the rising of the signal F, the signal O turns to a "high" level and the output from the terminal $\overline{Q}$ turns to a "low" level to thereby make the gate 15-2 closed for the signal F. The above-described function can be made by a general R-S flip-flop using the signals E and F respectively as a reset signal and a set signal. At the rising point of the signal O, a preset pulse g on a signal G is generated by a differential circuit constituted by a delay inverter 15-3 and a two-input AND gate 15-4. The signal G is fed to both the reference frequency divider 2 and the frequency divider 7 through a terminal 27. Although this embodiment shows the case where the signal D is used as a gating signal for the gates 3-2 and 3-3, the invention is applicable, alternatively, to the case where the signal D is replaced by the signal O fed from a terminal 28 in order to use the signal O as the gating signal.

The operation of the zero-phase detecting circuit 14 of FIG. 7 will be described hereunder by reference to the waveform diagram of FIG. 8. In FIG. 8, let the ratio of the frequency of clock J to the frequency of clock K be 10 to 13. Accordingly, let the ratio of the division modulus of the reference frequency divider 2 to the division modulus of the frequency divider 7 be 10 to 13. When the intermittent control signal A rises at a point in time $t_0$, the electric power source is correspondingly turned on for all of the circuits and then the signals F and O are turned to a "low" level by the reset pulse ER generated with a delay of time $\tau_2$. Thereafter, clock pulses $J_1$, $J_2$, etc., are fed to the terminal 25 and clock pulses $K_1$, $K_2$, etc., are fed to the terminal 26, successively. A pulse which corresponds to the phase difference between the clock signals J and K is generated from the gate 14-2 or 14-4 by the phase comparing part 16. In the drawing, the rising of the pulse $K_1$ is earlier in phase than the rising of the pulse $J_1$ and, accordingly, the phase difference pulse $L_1$ is sent out through the gates 14-2 and 14-12. In comparison between the next pulses $K_2$ and $J_2$, the falling of the pulse K is earlier than the rising of the pulse $J_2$ and, accordingly, the pulse $L_2$ is reset at the falling of the pulse $K_2$ by the gate 14-11. The next pulse $L_3$ which corresponds to the difference in rising phase between the pulses $J_2$ and $K_3$ is sent out through the gates 14-2 and 14-12. The next phase difference pulse $L_4$ is generated by the pulses $J_3$ and $K_4$, and successively, the phase difference pulse $L_5$ is generated in the same manner. Corresponding to these operations, clock pulses $N_1$, $N_2$, etc., are generated on signal N from the gate 14-15. By the pulse width discriminating function owing to the delay element 14-13 and the gate 14-14, the positive pulses on the signal L are converted to negative pulses having the width reduced by the time $\tau_3$. Thus, the negative pulses appear on signal M. In the drawing, a part of the signal M, which corresponds to the pulse $L_4$, is kept at a "high" level by the pulse width discriminating function. Accordingly, when the signal M is sampled by the rising of the signal N, pulses $F_1$, $F_2$, etc., on a signal F are obtained as shown in the drawing. The difference in rising phase between the clock signals J and K at the rising part of the signal F is within a range of $\pm\tau_3$. In other words, the zero-phase discrimination error is within a range of $\pm\tau_3$. Strictly speaking, the zero-phase discrimination error is slightly larger than $\tau_3$ because of the influence of the data-setup time and data-hold time of the flip-flop 14-16. More strictly speaking, the zero-phase discrimination error varies corresponding to the timing between the signals M and N. In order to adjust the timing, a delay element which is not shown in FIG. 7 for the purpose of simplifying illustration may be provided to the rear stage of the gate 14-14 or 14-15. By the rising of the pulse $F_1$ on the signal F, the signals D and O turn to a "high" level. Thereafter, operations as described above are carried out.

In the embodiment of FIG. 7, the delay elements 11-1, 11-3 and 14-13 and the delay inverters 12-1, 13-1 and 15-3 are employed as delay means. Those delay means can be attained by known techniques, such as delay circuits made up of a combination of resistors and capacitors, circuits made up of a combination of such a combination of resistors and capacitors and gates, circuits made by the cascade connection of gates, circuits made up of gates having the delay time increased, or the like. Furthermore, it is possible that a signal is partially delayed by the use of a suitable clock signal as described later.

In the embodiment shown in FIGS. 5 and 7, taking into consideration the response time of circuits as described above, the falling of the signal B and the rising of the signal C are delayed respectively relative to the falling of the signal A and the rising thereof. Accordingly, the effect of the embodiment is that the intermittent operation can be made without malfunction, or in other words the object of the invention can be surely attained.

Figure 9:
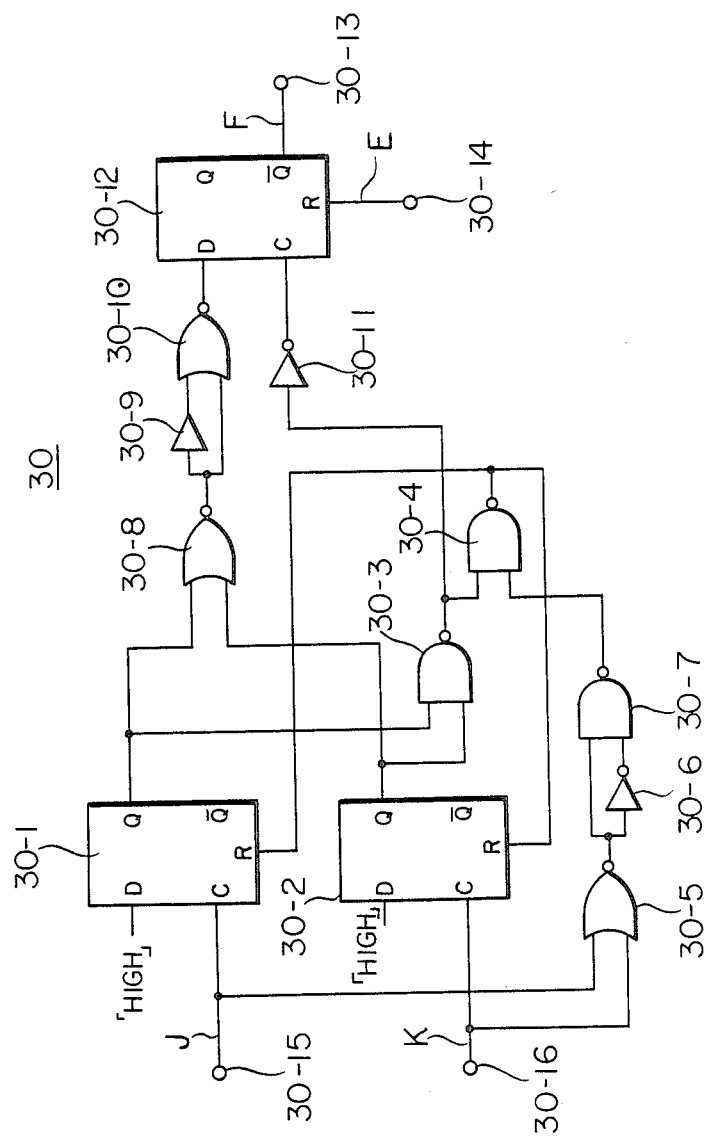
FIG. 9 is a diagram of a zero-phase detecting circuit depicted in FIG. 5.

FIG. 9 shows another embodiment of the zero-phase detecting circuit. The zero-phase detecting circuit 30 is made up of a phase comparing part constituted by D-type flip-flops 30-1 and 30-2 and gates 30-3 to 30-8, and a pulse width discriminating part constituted by gates 30-9 to 30-11 and a D-type flip-flop 30-12. The D-type flip-flops are of such a type that a data signal or an inverted data signal applied to a terminal D is transmitted directly or invertedly to a terminal Q or $\overline{Q}$, respectively, at the rising time of a clock signal fed to a terminal C and that the output of the terminal Q is reset to a "low" level when a signal applied to a terminal R is at a "high" level. The terminals D of the flip-flops 30-1 and 30-2 continuously receive "high" level data signals and the terminals C of the same receive clock signals J and K from terminals 30-15 and 30-16, respectively. The output signals of the two terminals Q are fed to both the two-input NAND gate 30-3 and the two-input NOR gate 30-8, and the output signal of the two-input NAND gate 30-4 is applied to the two terminals R. The output of the two-input NOR gate 30-5 receiving the clock signals J and K is fed to the two-input NAND gate 30-7 both directly and indirectly via the delay inverter 30-6. The output signals of the gates 30-3 and 30-7 are fed to the gate 30-4. The output of the gate 30-8 is fed to the two-input NOR gate 30-10 directly and indirectly via the delay element 30-9. The terminal D of the flip-flop 30-12 receives the output of the gate 30-10, and the terminal C of the same receives the output of the gate 30-3 passing through the delay inverter 30-11. Thus, the output of the terminal $\overline{Q}$, as a zero-phase signal F, is generated from a terminal 30-13. A reset signal E from the reset pulse generating circuit is applied to the terminal R of the flip-flop 30-12 to insure the operation thereof.

The operation of the embodiment of FIG. 9 is illustrated. The part made up of the flip-flops 30-1 and 30-2 and the gates 30-3 and 30-4 is a known phase/frequency comparator. A pulse which corresponds to the difference in rising phase between the clock signals J and K is generated from the terminal Q of either one of the flip-flops. In this embodiment, the gates 30-5 to 30-7 are additionally provided to thereby eliminate the frequency discriminating function. In other words, when the difference in rising phase between the clock signals J and K is larger than a half of the period of either signal, the flip-flop is reset by the falling of either signal having risen earlier. This operation is the same as in the zero-phase detecting circuit 14 of FIG. 7.

Figure 10:
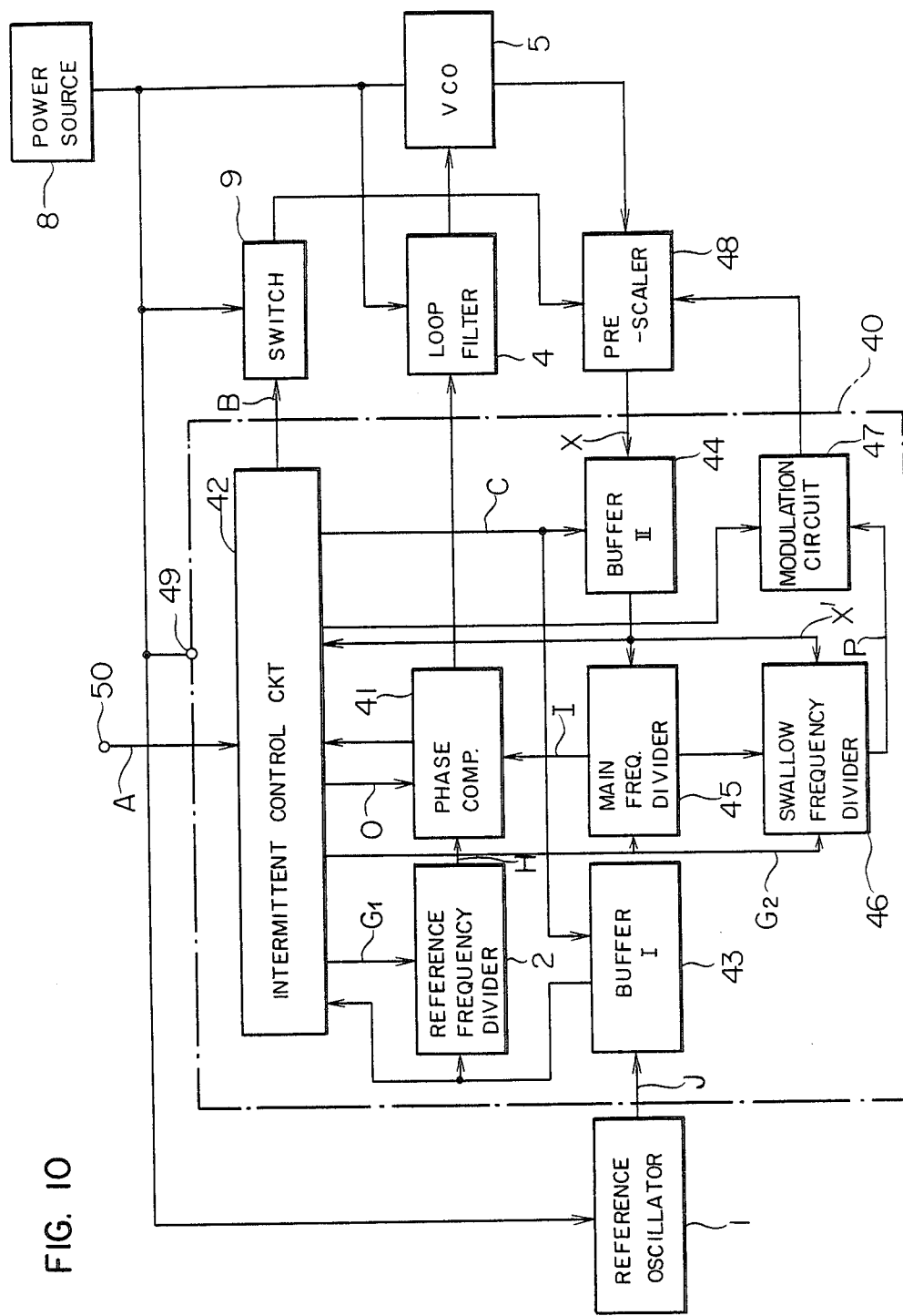
FIG. 10 is a block diagram of a further embodiment of the phase-locked oscillator of the present invention.
Figure 12:
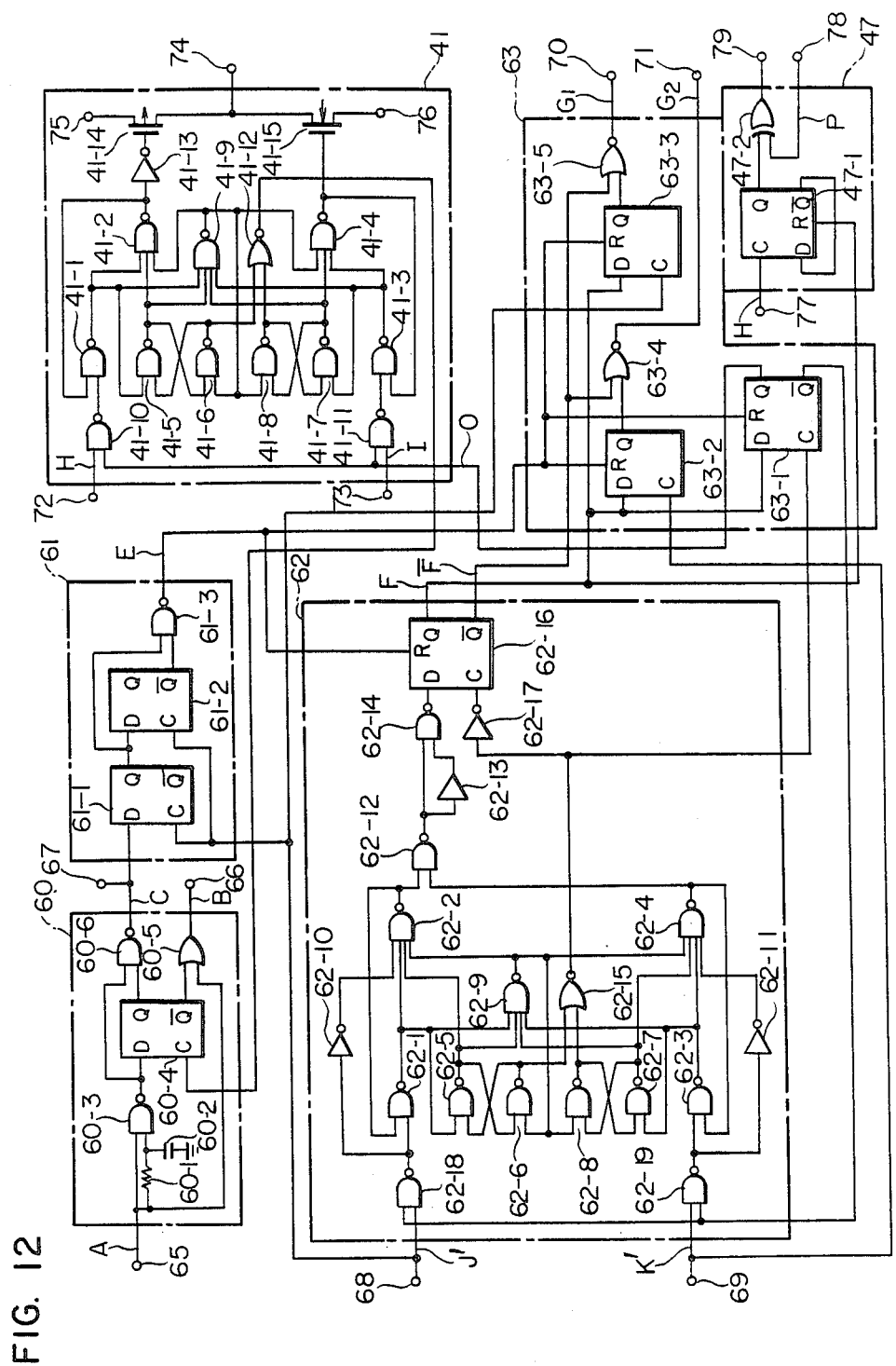

A further embodiment is shown in FIG. 10. FIG. 10 is a block diagram of a phase-locked oscillator positively using the features of CMOS circuits, and FIGS. 11A, 11B and 12 are diagrams showing part of the same in detail. An essential difference between the embodiment of FIG. 10 and the embodiment of FIGS. 5 and 7 will be now described. Of the functions of the voltage-hold circuit 10 shown in FIGS. 5 and 7, the sampling function is assigned to a phase comparator as described later and the voltage-hold function is assigned to a capacitor included in a loop filter 4. Accordingly, the voltage-hold circuit 10 shown in FIGS. 5 and 7 is removed and is not shown in FIG. 10. Although FIG. 5 shows the case where the output of the VCO 5 is divided by the combination of the pre-scaler 6 and the frequency divider 7, FIG. 10 shows the case where a two-modulus pre-scaler capable of selecting one from two frequency division moduli corresponding to the external signal is used as a pre-scaler 48 and where the output of the VCO 5 is divided by the combination of the pre-scaler 48, a main frequency divider 45 and a swallow frequency divider 46. The intermittent control circuit 42 of FIG. 10 represents several circuits lumped under one name or in other words the circuit 42 is a multifunctional circuit which is equivalent to all of the driving circuit 11, the control circuit 12, the reset pulse generating circuit 13, the zero-phase detecting circuit 14 and the preset pulse generating circuit 15 of FIG. 5. In FIG. 10, the part 40 surrounded by dotted chain lines, including the reference frequency divider 2, the phase comparator 41, an intermittent control circuit 42, a main frequency divider 45 and a swallow frequency divider 46 and further including buffers (I and II) 43 and 44 and a modulating circuit 47, is attained by CMOS circuits, for example, a CMOS custom integrated circuit. As commonly known, a CMOS circuit is characterized in that a current except a leak current does not occur as long as an input signal is fixed at a "low" level or a "high" level and in that an output signal of the static CMOS circuit is fixed as long as an input signal is fixed. In order to utilize these characteristics, a power source voltage is continuously impressed on a terminal 49 of the part 40 surrounded by the dotted chain lines, and the buffers 43 and 44 are respectively interposed between the reference oscillator 1 and the reference frequency divider 2 and between the two-modulus pre-scaler 48 and the main and swallow frequency divider 45 and 46. The intermittent operation is performed by interruption of a signal input to the buffers so that average electric power consumption is reduced. Generally a feedback signal is fed back from a swallow frequency divider to a two-modulus pre-scaler. The modulating circuit 47 inserted in the feedback path from the swallow frequency divider 46 to the two-modulus pre-scaler 48 as described later is used in this embodiment to thereby make the intermittent operation more securely.

Various parts will be now described by reference to the drawings, in which signals having the same function in FIGS. 5, 7, 10, 11A, 11B and 12 are identified by the same reference character. Embodiments of the buffer 43 or 44 are shown in FIGS. 11A and 11B. In the drawings, a clock signal J (or K) is fed to a terminal 51, an intermittent signal C is fed to a terminal 52, and an output clock signal J' (or K') is fed to both the reference frequency divider 2 (or main and swallow frequency dividers 45 and 46) and the intermittent control circuit 42. In the embodiment of FIG. 11A, the signals J (or K) and C are fed to a two-input NAND gate 54, and the output of the later is connected to the terminal 53. When the intermittent signal C is at a "high" level, the output signal J' (or K') of the NAND gate 53 is generated as an inverted signal of the signal J (or K). When the intermittent signal C is at a "low" level, the output of the NAND gate 53 is fixed at a "high" level. In the embodiment of FIG. 11B, PMOS transistors 57-2 and 57-3 and NMOS transistors 57-4 and 57-5 are serially connected in order between terminals 55 and 56, an NMOS transistor 57-6 is connected between the junction point between the transistors 57-3 and 57-4 and the terminal 56, the junction point being connected to a terminal 53. The respective gates of the transistors 57-2 and 57-5 are connected to the terminal 51, the gate of the transistor 57-4 is directly connected to the terminal 52, and the gates of the transistors 57-3 and 57-6 are connected to the terminal through an inverter 57-1. A feedback resistor 57-7 is inserted between the terminals 51 and 53. Generally, the terminal 55 is supplied with a positive electric source voltage and the terminal 56 is grounded. In this embodiment, when the intermittent signal C, applied to the terminal 52 is at a "high" level, the transistors 57-3 and 57-4 are conductive and the transistor 57-6 is non-conductive. Accordingly, the signal J (or K) applied to the terminal 51 is amplified and inverted and the inverted signal is sent out from the terminal 53. When the signal C is at a "low" level, the transistors 57-3 and 57-4 are non-conductive and the transistor 57-6 is conductive. Accordingly, the output is fixed at a "low" level.

The intermittent signal C is formed from the intermittent control signal A as described later. In the embodiment of FIG. 11A, when the signal C is at a "low" level, any electric current except a leak current flowing in the transistors forming the gate does not flow. In the embodiment of FIG. 11B, when the signal C is at a "low" level, any electric current except a leak current flowing in the transistors and resistor 57-7 does not flow. Furthermore, in both the embodiments, when the signal C is at a "low" level, the output level is fixed at either a "high" or a "low" level. Accordingly, any electric current except a leak current is not consumed in circuits connected to the rear stage of the respective buffer. Thus, the intermittent operation for the part 40 surrounded by the dotted chain lines can be equivalently made with keeping the application of a power source voltage to the terminal 49.

FIG. 12 shows a further embodiment. In the drawing, a driving circuit 60, a reset pulse generating circuit 61, a zero-phase detecting circuit 62 and a preset pulse generating circuit 63 correspond to the intermittent control circuit of FIG. 10. The reference numerals 60-4, 61-1, 61-2, 62-16, 63-1, 63-2, 63-3 and 47-1 respectively designate D-type flip-flops for transmitting the data signal from the terminal D to the terminal Q at the rising of the clock signal fed to the terminal C. Of these, the flip-flops having the terminal R are arranged so that the terminal Q is reset to a "low" level when the signal applied thereto turns to a "high" level.

In the driving circuit 60, an intermittent signal A from a terminal 65 passes through an integrated circuit constituted by a resistor 60-1 and a capacitor 62-2 and is fed to both a two-input AND gate 60-3 and a two-input NOR gate 60-5. The terminal D of the flip-flop 60-4 is connected to the output of the gate 60-3, the terminal C is connected to the output of a gate 41-12 of a phase comparator 41, the terminal Q is connected to the input of a gate 60-6, and the terminal $\overline{Q}$ is connected to the input of the gate 60-5. The output of the gate 60-3 is connected to the other input terminal of the two-input NAND gate 60-6, and the output signal C of the gate 60-6 is applied to the buffers 43 and 44 of FIG. 10 through a terminal 67. The output signal B of the gate 60-5 is applied to the switch 9 of FIG. 10 through a terminal 66.

In the reset pulse generating circuit 61, the first flip-flop 61-1 and the second flip-flop 61-2 are wired in a cascade connection. The first D terminal receives the signal C, the first Q terminal is connected to the second D terminal, and the first and second C terminals receive the signal J' from a terminal 68. The first and second Q terminals are connected to a two-input NAND gate 61-3, the output of the gate 61-3 being a reset signal E.

In the zero-phase detecting circuit 62, a circuit constituted by gates 62-1 to 62-15 and a flip-flop 62-16 is fundamentally equivalent to the zero-phase detecting circuit 14 of FIG. 3. In this embodiment, the signals J' and K' fed from the terminals 68 and 69 to be compared in zero-phase are respectively fed through gates 62-18 and 62-19 to the gates 62-1, 62-10 and 62-3, 62-11. The Q-terminal signal of a flip-flop 63-1 in the preset pulse generating circuit 63 is fed to the other input terminal in each of the two-input NAND gates 62-18 and 62-19. The signal F and the inverted signal $\overline{F}$ are generated from the terminals Q and $\overline{Q}$ of the flip-flop 62-16, and the signal E from the reset pulse generating circuit 61 is fed to the terminal R.

In the preset pulse generating circuit 63, the signal F fed to the terminals D of flip-flops 63-1 to 63-3 is respectively sampled by the output signal of the gate 62-15, the signal K', and the signal J'. The Q-terminal signal O of the flip-flop 63-1 is fed to two gates 41-10 and 41-11 in the phase comparator 41, and the $\overline{Q}$-terminal signal is fed to the gates 62-18 and 62-19. Both the Q-terminal signal of the flip-flop 63-2 and the signal $\overline{F}$ are fed to a two-input NOR gate 63-4, and the output signal $G_2$ of the gate 63-4 is supplied through a terminal 71 to both the main frequency divider 45 and the swallow frequency divider 46 of FIG. 10. Both the Q-terminal signal of the flip-flop 63-3 and the signal $\overline{F}$ are fed to a two-input NOR gate 63-5, and the output signal $G_1$ of the gate 63-5 is supplied through a terminal 70 to the reference frequency divider 2 of FIG. 10. The signal E is applied to the respective terminals R of the flip-flops 63-1 to 63-3.

In the phase comparator 41, a phase comparing circuit constituted by gates 41-1 to 41-9 is arranged in such a manner as disclosed in U.S. Pat. No. 3,610,954. The signals H and I fed from terminals 72 and 73 to be compared in phase are respectively passed through twoinput NAND gates 41-10 and 41-11 and fed to the gates 41-1 and 41-3. The output of the gate 41-2 is applied to the gate of a transistor 41-14 through an inverter 41-13, and the output of the gate 41-4 is applied to the gate of a transistor 41-15. The PMOS transistor 41-14 and the NMOS transistor 41-15 are serially connected between terminals 75 and 76 to thereby form a so-called charge-pump circuit. The signal at the junction point between the two transistors 41-14 and 41-15 is fed through a terminal 74 to the loop filter 4 of FIG. 10. The terminal 75 is energized with the same voltage as the terminal 49 of FIG. 10, and the terminal 76 is generally grounded. The output signal of a two-input NOR gate 41-12 receiving the output signals from the gates 41-6 and 41-8 is fed to the terminal C of the flip-flop 60-4.

In the modulating circuit 47, the signal H from a terminal 77 (that is, the output signal from the reference frequency divider 2 of FIG. 10) is applied to the terminal C of a flip-flop 47-1, the $\overline{Q}$-terminal signal is fed back to the terminal D, and the signal F is applied to the terminal R. Both the Q-terminal signal and the signal P from a terminal 78 (that is, the output signal from the swallow frequency divider 46 of FIG. 10) are fed to an exclusive OR (EX-OR) gate 47-2, and the output signal of the gate 47-2 is fed through a terminal 79 to the pre-scaler 48 of FIG. 10.

The operation of the embodiment shown in FIGS. 10 to 12 will be described hereunder. For the convenience of description, the technique of FIG. 11B is applied to each of the buffers 43 and 44. Because the operation of the embodiment shown in FIGS. 10 to 12 is fundamentally equal to that of the embodiment shown in FIGS. 5 and 7, description will be made with reference to the waveform diagrams of FIGS. 6 and 8. First, let the intermittent control signal A be at a "high" level to keep the intermittent operation at the "ON" state. In other words, let the phase-locked oscillator of FIG. 10 be in the phase-locked state. In this case, the signals B, C and O are at a "high" level. Accordingly, a signal which corresponds to the difference in rising phase between the signals H and I respectively fed to the terminals 72 and 73 is sent out through the terminal 74. Furthermore, a signal which rises when both the signals H and I turn to a "low" level is produced from the gate 41-12.

Next, the intermittent control signal A turns to a "low" level. However, the signals C and B remain at a "high" level till the clock signal to be fed from the gate 41-12 to the flip-flop 60-4 rises. When the clock signal rises after the terminal 74 turns into the "high-impedance" state owing to the last phase comparison in the phase comparator 41, the signals B and C turn to a "low" level. In other words, a little delay exists between the turning of the intermittent control signal A to a "low" level and the turning of the signals B and C to a "low" level. The delay is necessary for securely turning the terminal 74 into the "high-impedance" state. The delay is equivalent to the difference $\tau_1$ in falling time between the signals A and B as shown in FIG. 6. When the signal B turns to a "low" level, the switch 9 of FIG. 10 is opened to thereby interrupt the power supply to the pre-scaler 48. When the signal C turns to a "low" level, the output signals J' and K' from the buffers 43 and 44 are fixed at a "low" level (in the case of FIG. 11B). Accordingly, the output signals H and I from the reference frequency divider 2 and the main frequency divider of FIG. 10 remain at a "low" level, and the terminal 74 is kept in the "high-impedance" state. At this time, the VCO 5 is caused to freely oscillate with a regular frequency by the voltage held in the loop filter 4. The merit of the above-mentioned procedure for turning the intermittent operation into the "OFF" state exists in that the signal which corresponds to the difference in rising phase between the signals H and I at first after the returning into the "ON" state, can be generated without malfunction. Furthermore, when the signals A, B and C are at a "low" level, the circuit 40 and the pre-scaler 48 of FIG. 10 are in a state of no electric power consumption.

Next, when the intermittent control signal A returns to a "high" level, the signal B immediately turns to a "high" level to thereby restart power supply for the pre-scaler 48 through the switch 9. When the signal A turns from a "low" level to a "high" one, the gate 60-3 turns to a "low" level after the delay of time corresponding to a time constant determined by the resistor 60-1 and the capacitor 60-2 and, accordingly, the signal C turns to a "high" level. The delay of time is equivalent to the difference in rising time between the signals A and C shown in FIG. 6. When the signal C turns to a "high" level so that the operation of the buffers 43 and 44 restarts, clock signals are fed to the terminals 68 and 69. In the reset pulse generating circuit 61, the rising of the signal C is sampled by the signal J' at the two flip-flop 61-1 and 61-2, and a clock differentiated pulse is generated on the signal E. The flip-flops 62-16 and 63-1 to 63-3 are reset by this pulse. The Q output signal 0 of the flip-flop 63-1 turns to a "low" level to thereby disable the signals H and I from passing through the gates 41-10 and 41-11. On the other hand, the inverted ($\overline{Q}$) output signal turns to a "high" level to thereby enable the signals J' and K' to pass through the gates 62-18 and 62-19. When the difference in rising phase between the signals J' and K' goes into a certain limit, the zero-phase signal F turns to a "high" level in the same manner as described above in the Embodiment of FIG. 7. Because the output clock signal of the gate 62-15 rises when both pulses on the signals J' and K' fall, the signal F is sampled by the rising clock in the flip-flop 63-1. Then the Q-terminal signal O of the flip-flop turns to a "high" level and the $\overline{Q}$-terminal signal turns to a "low" level. As the result, the signals J' and K' are disabled from passing through the gates 62-18 and 62-19, and the signal F remains at a "high" level. Accordingly, in this embodiment the operation of the zero-phase detecting circuit 62 stops after the perfection of zero-phase detection. Accordingly, a merit exists in that unnecessary electric power is not consumed thereafter. Furthermore, the turning of the signal F from a "low" level to a "high" one is detected by the flip-flops 63-2 and 63-3 to thereby generate differential pulses from the gates 63-4 and 63-5. By the pulses on the signals $G_1$ and $G_2$, the reference frequency divider 2 and the main and swallow frequency dividers 45 and 46 are initialized, respectively. The signals H and I generated from the frequency dividers are compared in phase by the phase comparator 41 because the signal O has been at a "high" level. In other words, the phase-locked loop is closed to thereby perform general phase-synchronizing operation. The phase error signal first generated from the phase comparator 74 after intermittent operation returns into the "ON" state depends on the phase difference in rising between the signals J' and K' in the case where the zero-phase signal F turns to a "high" level. Accordingly, as the zero-phase detection width of the zero-phase detecting circuit 62 becomes narrower, the phase error signal becomes smaller and, accordingly, the frequency jump of the VCO 5 becomes less.

As described above, the "ON" state and the "OFF" state alternate corresponding to the level change of the intermittent control signal A and consequently average electric power consumption is reduced.

Finally, the operation of the modulating circuit 47 of FIG. 12 will be described. The above description is true based on the assumption that zero-phase detection can be unconditionally made by the zero-phase detecting circuit. An extreme example should be now considered. Let the frequency of the signals J' and K' be 5 MHz and 10 MHz, respectively. Let the zero-phase detection width of the zero-phase detecting circuit be 10 ns. If the difference in phase between the signals J' and K' just after the returning into the "ON" state is 30 ns, the difference in rising instantaneous phase between the signals J' and K' does not become shorter than 30 ns. That is, the zero-phase signal F remains at a "low" level and the phase-locked loop is not closed. Though such an extreme case need not be considered, there is a case where the time required for detecting the zero-phase state becomes longer dependently upon the relation between the frequency of the signals J' and K', and the zero-phase detection width. Widening the zero-phase detection width is a measure to solve the problem. However, according to this measure, another problem exists in that the probability of an initial phase error being enlarged increases to thereby make the frequency jump of the VCO large contrary to the object of the invention.

To solve the problem, the modulating circuit 47 is combined with the two-modulus pre-scaler 48. Because the zero-phase signal F is at a "low" level till the detection of the zero-phase state, a signal having the frequency half as much as the clock signal fed to the terminal C of a flip-flop 47-1 is generated from the terminal Q. Generally, the clock signal and the frequency division modulus can be suitably selected. In this embodiment, the output signal H of the reference frequency divider 2 is used as the clock signal, and the frequency division modulus is set to ½. The signal P from the swallow frequency divider 47 is modulated by the frequency division signal in an EX-OR gate 47-2. The modulated signal is applied to a frequency division modulus selection terminal of the two-input modulus pre-scaler 48 via the terminal 79. Accordingly, the frequency of the frequency-division clock signal K of the pre-scaler 48 is also modulated. Accordingly, the frequency of the signal K' fed to the terminal 69 is modulated. Accordingly, there increases the possibility that the time required for detecting the zero-phase becomes short, compared with the case where the frequency is fixed. This corresponds to the fact that the passage of a certain time makes the zero-phase detection possible if the frequency of the signal K' changes by 1% in the above-mentioned extreme case. After the perfection of zero-phase detection, the signal F turns to a "high" level and the Q-terminal signal of the flip-flop 47-1 turns to a "low" level. Accordingly, the signal P remaining at its original level is fed from the terminal 78 to the terminal 79. Accordingly, a combination frequency divider constituted by the two-modulus pre-scaler 48, the main frequency divider 45 and the swallow frequency divider 46 performs the normal frequency-dividing operation.

There is a case where it is necessary to fix the terminal 79 at a constant level in the "OFF" state of the intermittent operation corresponding to the two-modulus pre-scaler used. Although there is no indication in the embodiment of FIGS. 10 and 12. For example, when two-modulus pre-scaler MB501 made by FUJITSU is used and the terminal 79 is fixed at a "high" level in the "OFF" state of the intermittent operation, a current flows from the power source terminal 49 to the frequency-division modulus selection terminal via the gate 47-2 to thus consume unnecessary electric power. In this case, if the terminal 79 is fixed at a "low" level, an unnecessary current does not flow to thereby effectuate saving electric power. As described above, if necessary, the level of the terminal 79 may be established to a "high" or a "low" level or a "high-impedance" level corresponding to the two-modulus pre-scaler used, in the "OFF" state of the intermittent operation. The establishment can be easily attained by the provision of a known circuit to the rear stage of the gate 47-2 by the use of the signal C.

Although the embodiment of FIG. 10 shows the case where power source voltage is continuously applied to the reference oscillator 1, it is apparent that the object of the invention is attained by the application of power source voltage through the switch 9. Furthermore, it is a matter of course that, in the case where the loop filter 4 is constituted by passive elements, a power source voltage need not be applied thereto. Furthermore, the gating function due to the gates 41-10 and 41-11 and the signal 0 in the phase comparator 41 of FIG. 12 may be interposed between the phase comparator and the charge pump circuit.

Although the embodiment of FIG. 10 shows the case where the part 40 surrounded by the dotted chain lines is made up of static CMOS circuits, it is apparent from the above description that the static CMOS circuits may be partially replaced by dynamic CMOS circuits as long as the output of specific circuits are at a specific level in the "OFF" state of the intermittent operation. Accordingly, when circuits except specific circuits are replaced by dynamic CMOS circuits with keeping the output of the specific circuits at the specific level in the "OFF" state of the intermittent operation, the object of the invention can be attained. Furthermore, the pre-scaler, the active circuit part of the loop filter and the active circuit part of the reference oscillator may be made up of CMOS circuits and may be included in the part surrounded by the dotted chain lines of FIG. 10.

As described above with reference to FIGS. 10 to 12, when the main circuits of the phase-locked oscillator are made up of CMOS circuits, the intermittent operation is securely performed with the main circuits in which a power source voltage is continuously applied to. Furthermore, in the case where a two-modulus prescaler is used as the pre-scaler for dividing the output signal of the VCO, the pre-scaler frequency division modulus selection signal can be modulated just after the returning of intermittent operation into "ON" state till the perfection of zero-phase detection to thereby securely perform the zero-phase detecting operation.

As described above, according to the invention, the jump of VCO frequency can be reduced in spite of the intermittent operation of the partial circuit of the phase-locked oscillator by the addition of a small number of circuits to the conventional circuit. Accordingly, the consumption of electric power can be reduced. As the result, the original object of intermittent operation, that is, miniaturization of batteries in portable apparatus or extension of the lifetime thereof, can be attained. In addition, when the invention is applied to a radio receiver/transmitter, it is possible to perform more stable communication compared with the prior art.

What is claimed is:

1. A phase-locked oscillator comprising:
   a phase-locked loop which includes a reference oscillator, a reference frequency divider for dividing the output of said reference oscillator, a voltage-controlled oscillator, a first frequency divider for dividing the output of said voltage-controlled oscillator, a phase comparator for comparing respective phases of the output of said reference frequency divider and the output of said first frequency divider, and a loop filter generating a control voltage from the output of said phase comparator, said control voltage being applied to said voltage-controlled oscillator;
   a first switch for interrupting intermittently an electric power supplied from an electric power source to at least one of said reference oscillator, said reference frequency divider, said first frequency divider, said phase comparator and said loop filter;
   a second switch for interrupting intermittently said control voltage in synchronism with said first switch;
   a control voltage hold circuit located between said second switch and said voltage-controlled oscillator for holding said control voltage at a time when said second switch is changed from ON-state to OFF-state;
   a detecting circuit for detecting a transient at which said first switch is changed from an OFF-state to an ON-state; and an initial state setting circuit responsive to a detecting operation of said detecting circuit for initializing said reference frequency divider and said first frequency divider.

2. A phase-locked oscillator according to claim 1, in which said detecting circuit is arranged to detect said transient in response to a signal for driving at least one of said first and second switches.

3. A phase-locked oscillator according to claim 1, in which said detecting circuit is arranged to detect said transient in response to an output signal of at least one of said first and second switches.

4. An intermittently operative phase-locked oscillator comprising:
   a phase-locked loop which includes a voltage-controlled oscillator, a first frequency divider for dividing the output of said voltage-controlled oscillator, a reference oscillator, a second frequency divider for dividing the output of said reference oscillator, a phase comparator for comparing respective phases of the output of said first frequency divider and the output of said second frequency divider, and a loop filter generating a control voltage from the output of said phase comparator, said control voltage being applied to said voltage-controlled oscillator, a first switch for interrupting intermittently an electric power supplied to at least one of said first frequency divider, said reference oscillator, said second frequency divider, said phase comparator and said loop filter by an intermittent operation signal, and a control voltage hold circuit connected between said loop filter and said voltage-controlled oscillator for holding said control voltage during a period of interruption of the electric power supply;
   a zero-phase detecting circuit for detecting a state in which a difference in instantaneous phase between a first clock signal fed into said first frequency divider and a second clock signal fed into said frequency divider becomes substantially zero so as to generate a zero-phase signal;
   a preset pulse generating circuit for generating a preset pulse in synchronization with said zero-phase signal generated after said first switch is switched on; and
   said first and second frequency dividers being arranged to be simultaneously initialized to each initial state by said preset pulse.

5. A phase-locked oscillator according to claim 4, in which said zero-phase detecting circuit includes a phase comparing circuit for generating a pulse having a pulse width corresponding to a phase difference between said first clock signal and said second clock signal, a pulse width discriminating circuit for discriminating said pulse width and a sampling-hold circuit for sampling the output forma said pulse width discriminating circuit to obtain said zero-phase signal.

6. A phase-locked oscillator according to claim 4, further comprising:
   a second-switch for interrupting said output of said reference frequency divider and said output of said first frequency divider fed to said phase comparator;
   a third switch connected between said control voltage-hold circuit and said loop filter; and
   a control circuit for turning off said second switch and said third switch during a period from start of interruption of said electric power supply to a time when said zero-phase signal is first generated after applying said electric power supply.

7. A phase-locked oscillator according to claim 5 further comprising:

a second-switch for interrupting said output of said reference frequency divider and said output of said first frequency divider fed to said phase comparator;

a third switch connected between said control voltage-hold circuit and said loop filter; and a control circuit for turning off said second switch and said third switch during a period from start of interruption of said electric power supply to a time when said zero-phase signal is first generated after applying said electric power.

8. A phase-locked oscillator according to claim 4 further comprising:

a second switch for interrupting said output of said reference frequency divider and said output of said first frequency divider fed to said phase comparator; and a third switch connected between said control-voltage hold circuit and said loop filter; and a control circuit for turning off said third switch during a period from start of interruption of said electric power to a time when said zero-phase signal is first generated after applying of said electric power and for turning off said second switch during a period from just after applying of said electric power to the time when said zero-phase signal is first generated after applying of said electric power.

9. A phase-lock oscillator according to claim 6 further comprising:

a driving circuit for generating a first intermittent signal and a second intermittent signal;

said first intermittent signal being caused to turn from its "ON" state into its "OFF" state after the time when said intermittent control signal turns from its "ON" state to its "OFF" state, and caused to turn from its "OFF" state to its "ON" state when said intermittent control signal turns from its "OFF" state to its "ON" state;

said second intermittent signal being caused to turn from its "ON" state to its "OFF" state after the time when said intermittent control signal turns from its "ON" state to its "OFF" state, and caused to turn from its "OFF" state to its "ON" state after the time when said intermittent control signal turns from its "OFF" state to its "ON" state;

a reset pulse generating circuit for generating a reset pulse in synchronism with turning of said second intermittent signal from its "OFF" state to its "ON" state;

said preset pulse generating circuit being reset into its initial state by said reset pulse; and said first switch being caused to turn from its "ON" state to its "OFF" state in synchronism with turning of said first intermittent signal from its "ON" state to its "OFF" state.

10. A phase-locked oscillator according to claim 8, further comprising:

a driving circuit for generating a first intermittent signal and a second intermittent signal;

said first intermittent signal being caused to turn from its "ON" state to its "OFF" state after the time when said intermittent control signal turns from its "ON" state to its "OFF" state, and caused to immediately turn from its "OFF" state to its "ON" state when said intermittent control signal turns from its "OFF" state to its "ON" state;

said second intermittent signal being caused to turn from its "ON" state to its "OFF" state after the time when said intermittent control signal turns from its "ON" state to its "OFF" state, and caused to turn from its "OFF" state to its "ON" state after the time when said intermittent control signal turns from its "OFF" state to its "ON" state;

a reset pulse generating circuit for generating a reset pulse in synchronism with turning of said second intermittent signal from its "OFF" state it its "ON" state;

said preset pulse generating circuit being reset into its initial state by said reset pulse; and said first switch being caused to turn from its "ON" state to its "OFF" state in synchronism with turning of said first intermittent signal from its "ON" state to its "OFF" state.

11. A phaes-locked oscillator according to calim 9, in which said zero-phase detecting circuit is reset to its initial state by said reset pulse.

12. A phase-locked oscillator according to claim 10, in which said zero-phase detecting circuit is reset to its initial state by said reset pulse.

13. A phase-locked oscillator according to claim 4 further comprising:

a third frequency divider for dividing the output of said voltage-controller oscillator and for applying its output to said first frequency divider;

a fourth frequency divider for dividing the output of said reference oscillator and for applying its output to said second frequency divider.

14. A phase-locked oscillator according to claim 4 further comprising:

a multi-modulus prescaler interposed between said voltage-controlled oscillator and said first frequency divider having a plurality of frequency-division moduli one of which is selected by a selection signal, dividing the output signal from said voltage-controlled oscillator, and being power-supplied through said first switch;

said first frequency divider being constituted by a main frequency divider and a swallow frequency divider;

a frequency-division output signal being used as said first clock signal to be fed to respective clock terminals of said main frequency divider and said swallow frequency divider, a frequency-division output signal of said swallow frequency divider being fed back to said multi-modulus prescaler as said selection signal, a frequency-division output signal of said main frequency divider being fed to said phase comparator;

a modulating circuit for modulating a level of said selection signal with a suitable signal during a period from after switching on again of said electric power supply by said intermittent operation control signal till said zero-phase signal is generated at first after switching on of said electric power supply.

15. A phase-locked oscillator according to claim 14, in which said modulating circuit is continuously energized with a power supply while said multi-modulus prescaler is intermittently energized with said electric power supply through said first switch, said modulating circuit keeps said selection signal applied to said multi-modulus prescaler at a "high" level or a "low" level or a "high impedance" level while said first switch is in its off-state.

16. An intermittently operative phase-locked oscillator comprising:

a phase-locked loop which includes a voltage-controlled oscillator, a first frequency divider for dividing the output of said voltage-controlled oscillator, a reference oscillator, a second frequency divider for dividing the output of said reference oscillator, a phase comparator for comparing respective phases of the output of said first frequency divider and the output of said second frequency divider, a loop filter generating a control voltage from the output of said phase comparator and applying said control voltage to said voltage-controlled oscillator, and a first switch for interrupting an electric power supply by an intermittent operation control signal for at least said first frequency divider and said second frequency divider, comprising:

a zero-phase detecting circuit for detecting that a difference in instantaneous phase between a first clock signal to said first frequency divider and a second clock signal to said seccond frequency divider becomes substantially zero so as to generate a zero-phase signal;

a preset pulse generating circuit for generating a preset pulse in synchronization with said zero-phase signal generated at first after said electric power supply for said first and second frequency dividers is switched on by said intermittent control signal; and a control circuit for generating a first gate signal to turn off two second switches and to make a charge pump circuit in a "high impedance" state during a period from just before interruption of said electric power supply by said intermittent operation control signal till said zero-phase signal is generated at first after switching on of said electric power supply, said first and second frequency dividers being arranged to be simultaneously initialized to each initial state by said preset pulse, said phase comparator being constituted by said two second switches, a phase comparing circuit and said charge pump circuit, said two second switches interrupting each of said outputs of said first and second frequency dividers into said phase comparing circuit in response to said first gate signal, said charge pump circuit converting an output of said phase comparing circuit into analog voltage signal and becoming in a "high impedance" state in response to said first gate signal.

17. A phase-locked oscillator according to claim 16 in which at least said first frequency divider and said second frequency divider are constituted by CMOS circuits, and are provided with CMOS input gate circuits respectively inserted into input stages of said first and second frequency divider, and said CMOS circuit part and said CMOS input gate circuits are continuously energized with a power source voltage to keep the output of said CMOS input gate circuits at a "high" level or at a "low" level during a period corresponding to the "OFF" state of said intermittent operation control signal.

18. A phase-locked oscillator according to claim 17 further comprising:

a multi-modulus prescaler interposed between said voltage-controlled oscillator and said one of CMOS input gate circuit followed by said first frequency divider having a plurality of frequency-division moduli one of which is selected by a selection signal, dividing the output signal from said voltage-controlled oscillator, said prescaler being supplied with an electric power through said first switch, said first frequency divider being constituted by a main frequency divider and a swallow frequency divider, a frequency-division output signal being used as said first clock signal to be fed to respective clock terminals of said main frequency divider and said swallow frequency divider, a frequency-division output signal of said swallow frequency divider being fed back to said multi-modulus prescaler as said selection signal, a frequency-division output signal of said main frequency divider being fed to said phase comparator; and a modulating circuit for modulating a level of said selection signal with a suitable signal during a period from immediately after switching on again of said electric power supply by said intermittent operation control signal till said zero-phase signal is first generated after switching on again of said electric power supply.

* * * * *